US 7,514,958 B1

(12) United States Patent
Zhou et al.

(10) Patent No.: US 7,514,958 B1
(45) Date of Patent: Apr. 7, 2009

(54) INTEGRATED CIRCUIT HAVING A CONFIGURABLE LOGIC GATE

(75) Inventors: Yingjie Zhou, San Diego, CA (US); Ming Lin, Tustin, CA (US); Nathan Le, Gilbert, AZ (US); Mitchell Buznitsky, Carlsbad, CA (US); Yuqian C. Wong, San Diego, CA (US); Craig Stein, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/872,831

(22) Filed: Oct. 16, 2007

(51) Int. Cl.
*H03K 19/177* (2006.01)
(52) U.S. Cl. .............................. 326/38; 326/33; 326/136
(58) Field of Classification Search ............. 326/37–38, 326/41, 47, 33, 136
See application file for complete search history.

(56) References Cited

U.S. PATENT DOCUMENTS

| 6,784,718 | B2 * | 8/2004 | Okamoto et al. | ............. 327/333 |
| 7,305,646 | B2 * | 12/2007 | McGrath et al. | .............. 716/12 |
| 7,369,815 | B2 * | 5/2008 | Kang et al. | ................... 455/73 |

OTHER PUBLICATIONS

Broadcom Corporation, BCM 2004 Product Brief, pp. 1-2, Mar. 30, 2004, Irvine, CA.
Broadcom Corporation, BCM 2007 Product Brief, pp. 1-2, Sep. 25, 2006, Irvine, CA.
Broadcom Corporation, BCM 2040 Product Brief, pp. 1-2, Mar. 14, 2006, Irvine, CA.
Broadcom Corporation, BCM 2042 Product Brief, pp. 1-2, Nov. 8, 2006, Irvine, CA.
Broadcom Corporation, BCM 2044 Product Brief, pp. 1-2, Jan. 8, 2007, Irvine, CA.
Broadcom Corporation, BCM 2045 Product Brief, pp. 1-2, May 10, 2007, Irvine, CA.
Broadcom Corporation, BCM 2046 Product Brief, pp. 1-2, Jun. 19, 2007, Irvine, CA.
Broadcom Corporation, BCM 2047 Product Brief, pp. 1-2, Jan. 22, 2007, Irvine, CA.
Broadcom Corporation, BCM 2048 Product Brief, pp. 1-2, May 7, 2007, Irvine, CA.
Broadcom Corporation, BCM 2004 Product Brief, pp. 1-2, Jan. 31, 2007, Irvine, CA.
Broadcom Corporation, BCM 2046 Product Brief, pp. 1-2, Jun. 19, 2007, Irvine, CA.

* cited by examiner

*Primary Examiner*—James H Cho
(74) *Attorney, Agent, or Firm*—Brake Hughes Bellermann LLP

(57) ABSTRACT

In one general aspect, a system may include a circuit board, a first integrated circuit attached to the circuit board, and a second integrated circuit attached to the circuit board being separate from the first integrated circuit and configured to operate in multiple power domains that include at least a core power domain and an I/O power domain and that is configured with a logic gate to receive and process external requests from the first integrated circuit and internal requests from the second integrated circuit for a common external resource.

20 Claims, 4 Drawing Sheets

INTEGRATED CIRCUIT HAVING A CONFIGURABLE LOGIC GATE

TECHNICAL FIELD

This description relates to integrated circuits that may share a common resource.

BACKGROUND

An electronic device may use multiple integrated circuits on a printed circuit board (PCB) that provide various functions to operate the electronic device. For example, in a cellular phone there may be a cellular baseband integrated circuit and a Bluetooth/WLAN (wireless local area network) integrated circuit on the printed circuit board.

SUMMARY

The details of one or more implementations are set forth in the accompanying drawings and the description below. Other features will be apparent from the description and drawings, and from the claims.

DETAILED DESCRIPTION

In general, a system may include multiple integrated circuits that may be configured and arranged to access a common resource that may be external to the integrated circuits. At least one of the multiple integrated circuits may include a logic gate that is configured to receive internal requests and external requests from the other integrated circuits for access to the external resource. The integrated circuit with the logic gate may include multiple power domains. The operation of the logic gate may reside in a power domain that is tied to a system or PCB level power, such that the operation of the logic gate does not require powering up or waking up the entire integrated circuit on which the logic gate resides. Thus, for example, the multiple integrated circuits may share access to a common external resource through the operation of a logic gate on just one of the integrated circuits. An external request for access to the common external resource may be processed through the logic gate on one of the integrated circuits without having to power up the integrated circuit. A system configured in this exemplary manner may reduce the overall power consumption of the system and may reduce the overall number of components in a system making it a more cost efficient solution.

Figure 1:
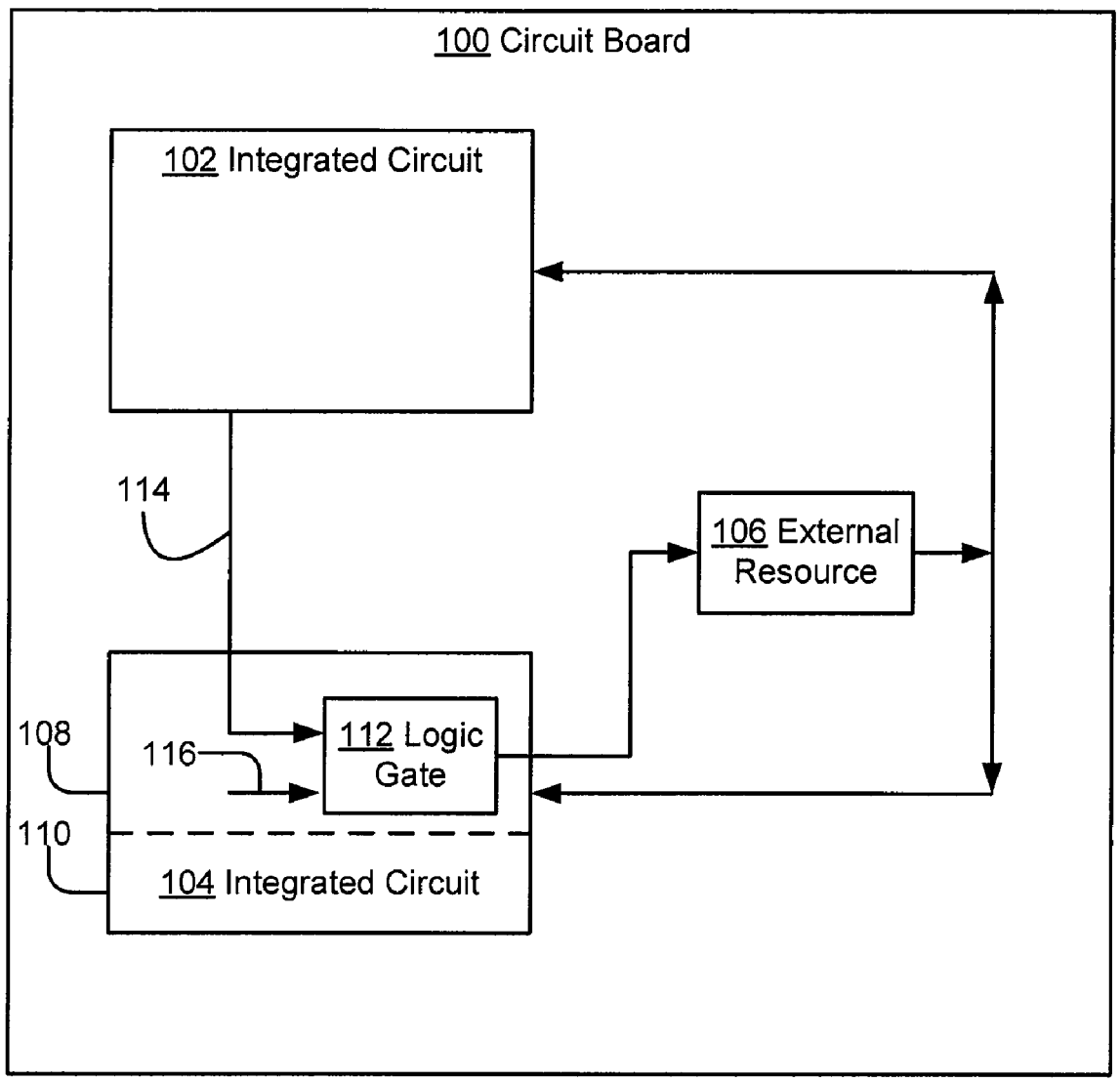
FIG. 1 is an exemplary block diagram illustrating an example system for integrated circuits to share a common resource.

Referring to FIG. 1, a circuit board 100 includes integrated circuit 102, integrated circuit 104 and external resource 106. Circuit board 100 may include a printed circuit board (PCB) or any other type of circuit board that is configured for use in any type of device including, for example, a cellular phone, a personal digital assistant (PDA), a computer, an MP3 player, an iPod® mobile digital device, and any other type of device that may use a circuit board. Circuit board 100 may provide one or more functions for the operation of a device. Circuit board 100 is exemplary in illustration and may include other components that are not shown.

Integrated circuit 102 may be attached to, mounted on or otherwise made a part of the circuit board 100. Integrated circuit 102 may be configured to provide one or more functions for the circuit board 100 that may contribute to the operation of a device.

Integrated circuit 104 may be attached to, mounted on or otherwise made a part of the circuit board 100. Integrated circuit 104 may be configured to provide one or more functions for the circuit board 100 that may contribute to the operation of a device. Integrated circuit 104 may be an integrated circuit that is separate from integrated circuit 102. In one exemplary implementation, integrated circuit 104 may be configured to provide functions that are different from integrated circuit 102. In other exemplary implementations, integrated circuit 104 may provide the functions that are the same as or functions that overlap with integrated circuit 102. Integrated circuit 104 and integrated circuit 102 may be configured to operate on the same circuit board 100 and may be configured to communicate with each other or otherwise connected to each other through the circuit board 100.

In other exemplary implementations, integrated circuit 102 and integrated circuit 104 may be a part of the same integrated circuit component to provide the functionality of both integrated circuits in a single integrated circuit.

External resource 106 may be a component that may be attached to, mounted on or otherwise made a part of the circuit board 100. External resource 106 may be a component on the circuit board 100 that is commonly shared by integrated circuit 102 and integrated circuit 104. Sharing the external resource 106 by integrated circuit 102 and integrated circuit 104 may eliminate any need or requirement for each integrated circuit 102 and 104 having a dedicated external resource. This may lead to a reduction of the number of components on circuit board 100. The reduction of the number of components on the circuit board 100 may realize a cost savings for the production of the circuit board 100. Sharing the external resource 106 also may reduced the overall system power consumption. External resource 106 may include any type of component that may be used on a circuit board including, for example, an integrated circuit, a clock source, or any other type of component.

Integrated circuit 104 may include multiple power domains such that a first section 108 of the integrated circuit 104 is part of a first power domain and a second section 110 of the integrated circuit 104 is part of a second power domain. Integrated circuit 104 may include more than two power domains with components of the integrated circuit being located in different power domains. Multiple power domains may enable the integrated circuit 104 to be configured to operate different parts of the circuit at different power levels and to receive the power for the different power domains from different power sources. For example, the first section 108 that may be powered by the first power domain may operate at a different power level than the second section 110 that may be powered by the second power domain. The power source for the first section 108 also may be different than the power source for the second section 110. Multiple power domains that have different power sources may enable an integrated circuit to be configured such that just a portion of the integrated circuit needs to be powered up when a particular component on the integrated circuit is used.

In one exemplary implementation, the first section 108 may be within an input/output (I/O) power domain and the second section 110 may be within a core power domain. For example, the I/O power domain may operate at a lower power level than the core power domain. The I/O power domain and the core power domain also may receive power from different power sources. For instance, the I/O power domain may receive power from circuit board 100 (e.g., voltage, vddo, at the PCB level) and the core power domain may receive power from within the integrated circuit 104. Since the first section 108 may be within the I/O power domain, the first section 108 may be powered up independently and separate from the second section 110 and any other sections that may exist. Thus, the second section 110 may remain in a powered down or sleep state when the first section 108 is powered up.

Integrated circuit 104 may include a logic gate 112. Logic gate 112 may include an OR gate, an AND gate, a NAND gate or any other type of logic gate. In one exemplary implementation, logic gate 112 may be located within the first section 108 of the integrated circuit 104 and within the first power domain. In one exemplary implementation, the logic gate 112 may be configured to receive and process requests from integrated circuit 102 and integrated circuit 104 for access to external resource 106. For instance, the logic gate 112 may receive and process external requests 114 from integrated circuit 102 and internal requests 116 from integrated circuit 104 for access to the common external resource 106. The external resource 106 may provide a function or services to the requesting integrated circuit in response to the request.

Logic gate 112 may be configurable to receive and process external requests 114 and internal requests 116 of different or opposite polarities. For instance, logic gate 112 may be configurable to receive and process external requests 114 and internal requests 116 that are either an active high request or an active low request. For example, if integrated circuit 102 is designed to request the external resource 106 using an active high request, then logic gate 112 may be configured to receive and process the external request 114 as an active high request. Alternatively, for example, if integrated circuit 102 is designed to request the external resource 106 using an active low request, then logic gate 112 may be configured to receive and process the external request 114 as an active low request. In this manner, for instance, if integrated circuit 102 and integrated circuit 104 are manufactured and designed by different entities, then the logic gate 112 on the integrated circuit 104 may be configured to receive and process an external request 114 from integrated circuit 102 without have to change the design of integrated circuit 102 or reconfigure how integrated circuit 102 requests external resource 106.

In one exemplary implementation, external resource 106 may be a clock source and the logic gate 112 may be an OR gate. Integrated circuit 102 and integrated circuit 104 may share the same clock source by sending requests for the clock source through the OR gate located in the second section 110 of the integrated circuit 104. For instance, when integrated circuit 102 wants to request access to the clock source, integrated circuit 102 sends an external request 114 to the OR gate located on integrated circuit 104. The OR gate may be located in the first section 108 of the integrated circuit 104, where the first section 108 may be powered by the I/O power domain. The OR gate receives and processes the external request 114 and sends the request to the clock source. The clock source receives the request and provides a clocking function to the integrated circuit 102.

In the above exemplary implementation, if the first section 108 is powered in the I/O power domain, then the external request 114 may be received and processed by the OR gate without waking up or powering up integrated circuit 104 or at the least by just partially powering up integrated circuit 104. Thus, integrated circuit 102 may request the OR gate through integrated circuit 104 without waking up or powering up integrated circuit 104 or at the least by only partially powering up integrated circuit 104.

In one exemplary implementation, integrated circuit 104 may be configured to operate in one or more modes. For example, integrated circuit 104 may be configured to operate in a mode that uses the functionality of the logic gate 112. Alternatively, integrated circuit 104 may be configured to operate in a mode that does not use the functionality of the logic gate 112 even though the logic gate 112 is present on the integrated circuit 104.

Figure 2:
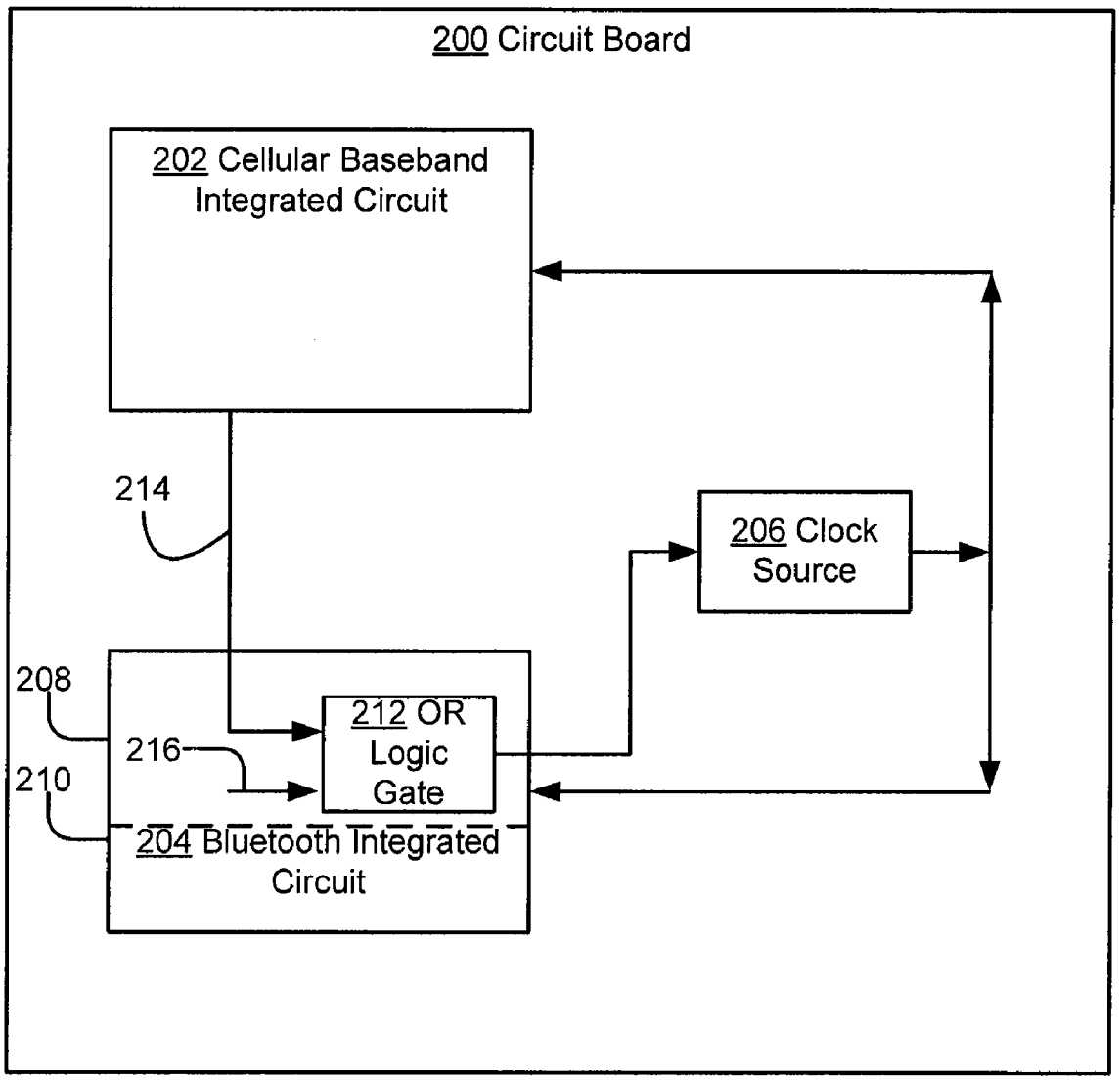
FIG. 2 is an exemplary block diagram illustrating an example system for integrated circuits to share a common resource.

Referring to FIG. 2, circuit board 200 is illustrated. Circuit board 200 includes cellular baseband integrated circuit 202, Bluetooth integrated circuit 204 and a clock source 206. In this exemplary implementation, circuit board 200 may be a circuit board that is included in a cellular phone device or any other electronic device that includes a cellular baseband integrated circuit 202 and a Bluetooth integrated circuit 204. FIG. 2 is provided as an exemplary illustration and is not meant to be limiting in any manner.

Cellular baseband integrated circuit 202 may be attached to, mounted on or otherwise made a part of the circuit board 200. Cellular baseband integrated circuit 202 may be configured to provide one or more cellular baseband-related functions to the operation of a device.

Bluetooth integrated circuit 204 may be attached to, mounted on or otherwise made a part of the circuit board 200. Bluetooth integrated circuit 204 may be configured to provide one or more Bluetooth-related functions to the operation of the device. Bluetooth integrated circuit 204 may be an integrated circuit that is separate from cellular baseband integrated circuit 202. In other exemplary implementations, cellular baseband integrated circuit 202 and Bluetooth integrated circuit 204 may be a part of the same integrated circuit component to provide the functionality of both integrated circuits in a single integrated circuit.

Clock source 206 may be attached to, mounted on or otherwise made a part of the circuit board 200. Clock source 206 may be a single clock source that is configured to provide clocking functions to both cellular baseband integrated circuit 202 and Bluetooth integrated circuit 204. Sharing the clock source 206 by cellular baseband integrated circuit 202 and Bluetooth integrated circuit 204 may eliminate any need or requirement for each circuit to have a dedicated clock source. This may lead to a reduction of the number components on circuit board 200. The reduction of the number of components on the circuit board 200 may realize a cost savings for the production of the circuit board 200 and/or also may realize a reduction in the overall system power consumption. In one exemplary implementation, the clock source 206 includes a temperature compensation crystal oscillator (TCXO).

Bluetooth integrated circuit 204 may include multiple power domains such that a first section 208 of the Bluetooth integrated circuit 204 is part of a first power domain and a second section 210 of the integrated circuit 204 is part of a second power domain. Bluetooth integrated circuit 204 may include more than two power domains with components of the integrated circuit being located in different power domains. Multiple power domains may enable the Bluetooth integrated circuit 204 to be configured to operate different parts of the circuit at different power levels and to receive the power for the different power domains from different power sources. For example, the first section 208 that may be powered by the first power domain may operate at a different power level than the second section 210 that may be powered by the second power domain. The power source for the first section 208 also may be different than the power source for the second section 210. Multiple power domains that have different power sources may enable an integrated circuit to be configured such that just a portion of the integrated circuit needs to be powered up when a particular component on the integrated circuit is used.

In one exemplary implementation, the first section 208 may be within an input/output (I/O) power domain and the second section 210 may be within a core power domain. For example, the I/O power domain may operate at a lower power level than the core power domain. The I/O power domain and the core power domain also may receive power from different power sources. For instance, the I/O power domain may receive power from circuit board 200 and the core power domain may receive power from within the Bluetooth integrated circuit 204. Since the first section 208 may be within the I/O power domain, the first section 208 may be powered up independently and separate from the second section 210 and any other sections that may exist. Thus, the second section 210 may remain in a powered down or sleep state when the first section 208 is powered up.

Bluetooth integrated circuit 204 includes an OR logic gate 212. In one exemplary implementation, the OR logic gate 212 may be configured to receive and process requests from cellular baseband integrated circuit 202 and Bluetooth integrated circuit 204 for access to clock source 206. For instance, the OR logic gate 212 may receive and process external requests 214 from cellular baseband integrated circuit 202 and internal requests 216 from Bluetooth integrated circuit 204 for access to the common clock source 206. The clock source 206 may provide a clocking function to the requesting integrated circuit in response to the request. The OR logic gate 212 may be located in the first section 208 of the Bluetooth integrated circuit 204, where the first section 208 may be powered by the I/O power domain. The OR logic gate 212 receives and processes the external request 214 and sends the request to the clock source 206. The clock source 206 receives the request and provides a clocking function to the baseband integrated circuit 202.

In the above exemplary implementation, if the first section 208 is powered in the I/O power domain, then the external request 214 may be received and processed by the OR logic gate 212 without waking up or powering up Bluetooth integrated circuit 204 or at the least by just partially powering up Bluetooth integrated circuit 204. Thus, baseband integrated circuit 202 may request the OR logic gate 212 through Bluetooth integrated circuit 204 without waking up or powering up Bluetooth integrated circuit 204 or at the least by only partially powering up Bluetooth integrated circuit 204.

OR logic gate 212 may be configurable to receive and process external requests 214 and internal requests 216 of different or opposite polarities. For instance, OR logic gate 212 may be configurable to receive and process external requests 214 and internal requests 216 that are either an active high request or an active low request. For example, if cellular baseband integrated circuit 202 is designed to request the clock source 206 using an active high request, then OR logic gate 212 may be configured to receive and process the external request 214 as an active high request. Alternatively, for example, if cellular baseband integrated circuit 202 is designed to request the clock source 206 using an active low request, then OR logic gate 212 may be configured to receive and process the external request 214 as an active low request. In this manner, for instance, if cellular based integrated circuit 202 and Bluetooth integrated circuit 204 are manufactured and designed by different entities, then the OR logic gate 212 on the Bluetooth integrated circuit 204 may be configured to receive and process an external request 214 from cellular baseband integrated circuit 202 without have to change the design of cellular baseband integrated circuit 202 or reconfigure how cellular baseband integrated circuit 202 requests clock source 206.

In one exemplary implementation, Bluetooth integrated circuit 204 may be configured to operate in one or more modes. For example, Bluetooth integrated circuit 204 may be configured to operate in a mode that uses the functionality of the OR logic gate 212. Alternatively, Bluetooth integrated circuit 204 may be configured to operate in a mode that does not use the functionality of the OR logic gate 212 even though the OR logic gate 212 is present on the Bluetooth integrated circuit 204.

In other exemplary implementations, cellular baseband integrated circuit 202 and Bluetooth integrated circuit 204 may share the clock source 206, but with the OR logic gate 212 located on the cellular integrated circuit 202 instead of on the Bluetooth integrated circuit 204.

In other exemplary implementations, cellular baseband integrated circuit 202 and Bluetooth integrated circuit 204 may share the clock source 206, but with the OR logic gate 212 located on both the cellular integrated circuit 202 and on the Bluetooth integrated circuit 204. In this exemplary implementation, the integrated circuits may be set in different modes, with one of the integrated circuits configured to operate in a mode where the OR logic gate 212 is active and the other integrated circuit configured to operate in a mode where the OR logic gate 212 is inactive, even though the OR logic gate 212 is present on that integrated circuit.

Figure 3:
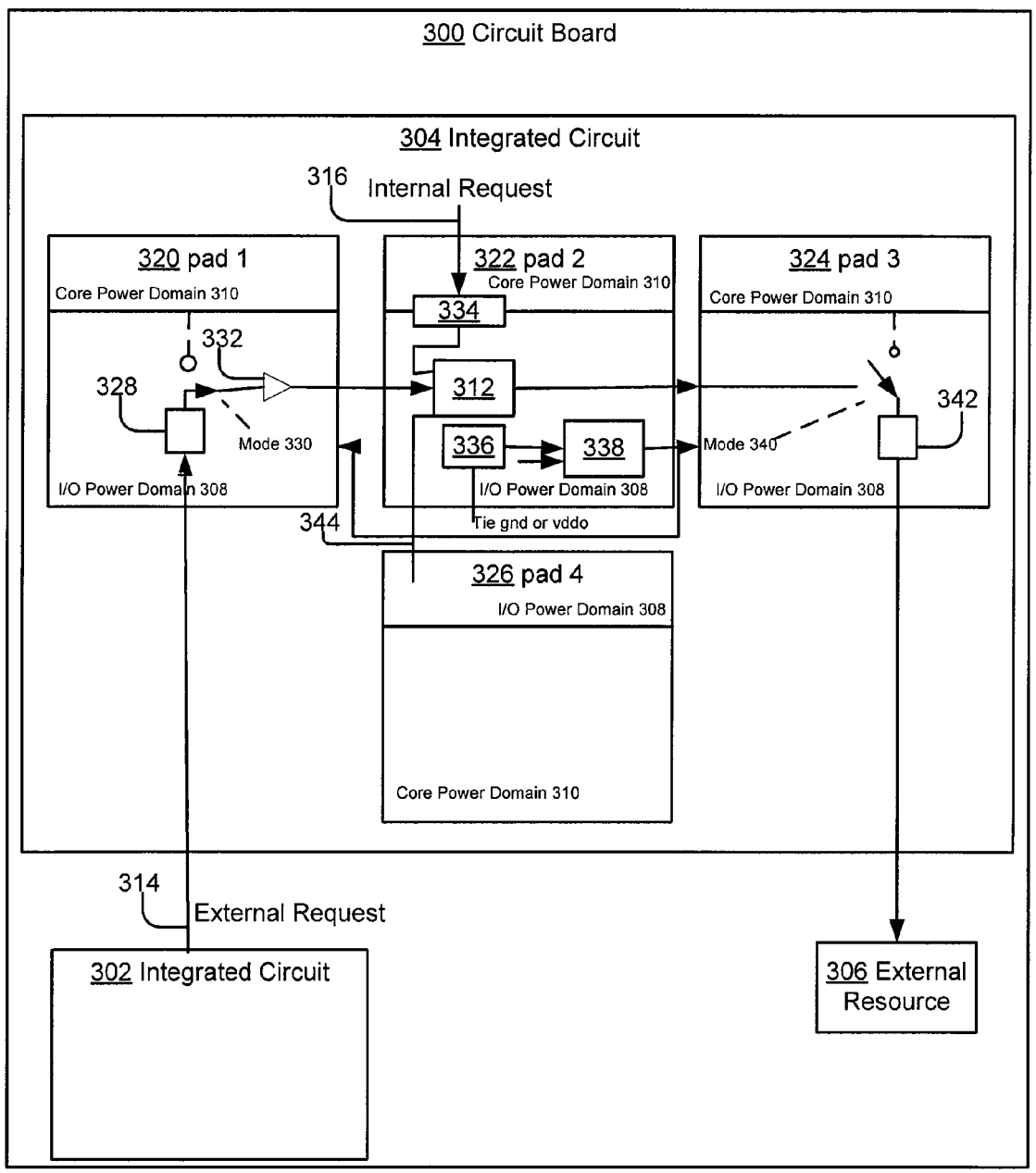
FIG. 3 is an exemplary block diagram of a circuit board illustrating an example system for integrated circuits to share a common resource.

Referring to FIG. 3, a circuit board 300 includes integrated circuit 302, integrated circuit 304 and external resource 306 that may, for example, operate and function like circuit board 100, integrated circuit 102, integrated circuit 104 and external resource 106 as described above with respect to FIG. 1. Thus, for example, integrated circuit 302 and integrated circuit 304 may share a common external resource, where a logic gate 312 on integrated circuit 304 may receive and process external requests 314 from integrated circuit 302 and internal requests 316 from integrated circuit 304 for access to external resource 306.

Integrated circuit 304 may include one or more pads such as, for example, pad 1 320, pad 2 322, pad 3 324 and pad 4 326. The pads 320, 322, 324, and 326 may be divided into sections that may represent one or more power domains. For instance, pads 320, 322, 324 and 326 may include a first section 308 in the I/O power domain and a second section 310 in the core power domain. In one exemplary implementation, the first section 308 may be at a first voltage level and the second section 310 may be at a second voltage level. In one implementation, the first section 308 associated with the I/O power domain may be tied to ground or the voltage (e.g., vddo) at the circuit board 300 level. Components or functions that operate or perform in the first section 308 may need power only from the I/O power domain in order to operate.

Pad 1 320 may include a connection pad 328 to receive an input for the external request 314 from integrated circuit 302. Pad 1 320 also may include a mode switch 330 that may operate to switch pad 1 320 between a normal mode and a mode that directs the external request 314 through a buffer 332 to pad 2 322.

Pad 2 322 may include a level shifter 334 that receives an input for the internal request 316 and that shifts the voltage level from the core power domain in the second section 310 to the voltage level in the I/O power domain in the first section 308. Pad 2 322 also includes logic gate 312. Logic gate 312 may include any type of logic gate. In one exemplary implementation, logic gate 312 includes an OR logic gate. Pad 2 322 includes a connection point 336 that may tie pad 2 322 either to ground or to vddo at the circuit board 300 level. Pad 2 322 includes a mode function gate 338 that may be configured to control the modes of operation of the pads 320, 322 and 324. In one exemplary implementation, when pad 2 322 is tied to ground, then mode function gate 338 sends a signal to pad 1 320 and pad 3 324 to operate in a normal mode. When pad 2 322 is tied to vddo, then mode function gate 338 sends a signal to pad 1 320 and pad 3 324 to operate in a mode that enables the external requests 314 and internal requests 316 to be received and processed through the logic gate 312 to request external resource 306.

Pad 3 324 includes a mode switch 340 that may operate to switch pad 3 324 between a normal mode and a mode that directs the output of logic gate 312 out through a connection point 342 to external resource 306.

Pad 4 326 includes a polarity output 344 that may be used as an input to logic gate 312 to control the polarity input recognized by the logic gate 312. For example, logic gate 312 may be configured to receive an active high polarity or an active low polarity.

In one exemplary implementation, the external resource 306 may include a clock source and the logic gate 312 may include an OR logic gate. When integrated circuit 302 needs to request the clock source 306, an external request 314 is sent to pad 1 320 through connection point 328. The external request 314 may go through buffer 332 and then to OR logic gate 312 on pad 2 322. The OR logic gate 312 then sends the request for the clock source 306 through pad 3 324 through connection point 342. In this exemplary implementation, pad 2 322 may be tied to vddo through connection point 336 and the I/O power domain may provide the power for the OR logic gate 312 to receive and process the external request 314 such that integrated circuit 304 does not need to be powered up to handle the external request 314. When integrated circuit 304 needs to request the clock source 306, an internal request 316 is sent to level shifter 334 and then to OR logic gate 312. OR logic gate 312 may receive and process the request and send the request for the clock source 306 through pad 3 324 through connection point 342.

Figure 4:
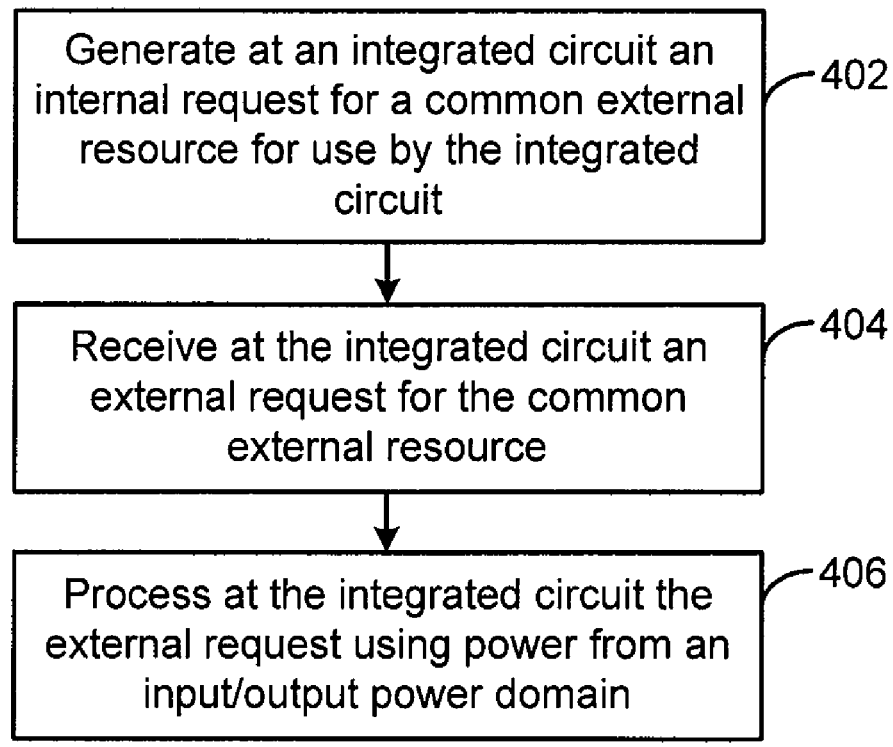
FIG. 4 is an exemplary flowchart illustrating a process for sharing a common external resource.

Referring to FIG. 4, an exemplary process 400 is illustrated for sharing a common external resource. Process 400 may include generating an internal request at an integrated circuit for a common external resource for use by the integrated circuit (402), receiving at the integrated circuit an external request for the common external resource (404), and processing at the integrated circuit the external request using power from an I/O power domain (406).

In one exemplary implementation, the common external resource may include a clock source. For instance, external resource 106 of FIG. 1, clock source 206 of FIG. 2 and external resource 306 of FIG. 3 are examples of the common external resource. The internal request that is generated for the common external resource (402) may include, for example, the internal requests 116 of FIG. 1, 216 of FIG. 2, and 316 of FIG. 3 that are generated by integrated circuit 104 of FIG. 1, 204 of FIG. 2 and 304 of FIG. 3, respectively.

The external request for the common external resource that is received at the integrated circuit (404) may include for example, external request 114 of FIG. 1, 214 of FIG. 2 and 314 of FIG. 3 that is received at integrated circuit 104 of FIG. 1, 204 of FIG. 2 and 304 of FIG. 3, respectively. The external request may be processed at the integrated circuit using power from the I/O power domain (406) using, for example, logic gate 112 located in the first section 108 of integrated circuit 104, OR logic gate 212 located in the first section 208 of integrated circuit 204, or logic gate 312 located in the I/O power domain 308 of integrated circuit 304 of FIGS. 1, 2, and 3, respectively.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A system, comprising:
a circuit board;
a first integrated circuit attached to the circuit board; and
a second integrated circuit attached to the circuit board being separate from the first integrated circuit and configured to operate in multiple power domains that include at least a core power domain and an input/output (I/O) power domain and that is configured with a logic gate to receive and process external requests from the first integrated circuit and internal requests from the second integrated circuit for a common external resource.

2. The system of claim 1 wherein the second integrated circuit is configured to receive and process the external requests from the first integrated circuit for the common external resource using power from the I/O power domain.

3. The system of claim 1 wherein the second integrated circuit is configured to receive and process the external requests from the first integrated circuit for the common external resource by partially powering up the second integrated circuit.

4. The system of claim 1 wherein the second integrated circuit is configured to receive and process the external requests from the first integrated circuit for the common external resource without powering up the second integrated circuit.

5. The system of claim 1 wherein the logic function within the second integrated circuit is configurable to process external requests from the first integrated circuit having a first polarity and a second polarity, wherein the second polarity is different from the first polarity.

6. The system of claim 1 wherein:
the first integrated circuit includes a cellular baseband integrated circuit attached to the circuit board;
the common external resource includes a clock source; and
the second integrated circuit includes a Bluetooth integrated circuit attached to the circuit board that is configured to operate in multiple power domains that include a core power domain and an I/O power domain and that is configured with the logic gate to receive and process external requests from the cellular baseband integrated circuit for the clock source and internal requests from the Bluetooth integrated circuit for the clock source such that the external requests are received and processed using power from the I/O power domain.

7. The system of claim 1 wherein the logic gate is an OR logic gate.

8. An integrated circuit, comprising:
a first section configured to receive power from a first power domain and configured to receive a first input request from an external requesting source for an external resource;
a second section configured to received power from a second power domain and configured to receive a second input request from an internal requesting source for the external resource; and
a logic gate located within the first section and configured to perform a logic operation to process the first input request and the second input request for the external resource.

9. The integrated circuit of claim 8 wherein the first power domain is an input/output power domain and the second power domain is a core power domain, wherein the input/output power domain is configured to operate at a lower voltage than the core power domain.

10. The integrated circuit of claim 8 wherein the external resource includes a clock source.

11. The integrated circuit of claim 10 wherein the clock source includes a temperature compensation crystal oscillator (TCXO).

12. The integrated circuit of claim 8 wherein:
the first input request includes a clock request input;
the first power domain includes an input/output power domain;
the external requesting source includes an external integrated circuit such that the first section receives the clock request input from the external integrated circuit;
the external resource includes a clock source; and
the logic gate includes an OR gate to process the clock request input for the clock source.

13. The integrated circuit of claim 8 wherein:
the second input request includes a clock request input;
the second power domain includes a core power domain;
the internal requesting source includes a component that initiates the clock request input;
the external resource includes a clock source; and
the logic gate includes an OR gate to process the clock request input for the clock source.

14. The integrated circuit of claim 8 wherein:
the first input request includes an active high request; and
the logic gate is configured to process the active high request for the external resource.

15. The integrated circuit of claim 8 wherein:
the first input request includes an active low request; and
the logic gate is configured to process the active low request for the external resource.

16. The integrated circuit of claim 8 further comprising a level shifter that is configured to shift a voltage for the second input request from a first voltage level associated with the second power domain to a second voltage level associated with the first power domain.

17. The integrated circuit of claim 8 wherein:
the first input request includes a first clock request input;
the first power domain includes an input/output power domain;
the external requesting source includes an external integrated circuit such that the first section receives the clock request input from the external integrated circuit;
the external resource includes a clock source;
the second input request includes a second clock request input;
the second power domain includes a core power domain;
the internal requesting source includes a component that initiates the first clock request input; and
the logic gate includes an OR gate to process the first clock request input and the second clock request input for the clock source.

18. A method for sharing a common external resource, the method comprising:
- generating at an integrated circuit an internal request for a common external resource for use by the integrated circuit;
- receiving at the integrated circuit an external request for the common external resource; and
- processing at the integrated circuit the external request using power from an I/O power domain.

19. The method as in claim 18 wherein the common external resource includes a clock source.

20. The method as in claim 18 wherein processing at the integrated circuit the external request includes using an OR logic gate to process the external request for the common external resource.

* * * * *